(12) United States Patent
Kim et al.

(10) Patent No.: US 6,933,758 B2
(45) Date of Patent: Aug. 23, 2005

(54) SYNCHRONOUS MIRROR DELAY CIRCUIT WITH ADJUSTABLE LOCKING RANGE

(75) Inventors: Tae-Hyoung Kim, Seongnam (KR); Yong-Jin Yoon, Seoul (KR); Nam-Seog Kim, Seoul (KR); Kwang-Jin Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/308,453

(22) Filed: Dec. 3, 2002

(65) Prior Publication Data

US 2003/0122598 A1 Jul. 3, 2003

(30) Foreign Application Priority Data

Jan. 3, 2002 (KR) .............................. 2002-230

(51) Int. Cl.[7] .................................................. H03L 7/00
(52) U.S. Cl. ........................................ 327/161; 327/141
(58) Field of Search ................................ 327/141, 149, 327/152, 153, 158, 161, 291, 298, 299

(56) References Cited

U.S. PATENT DOCUMENTS

| | | | | |
|---|---|---|---|---|
| 6,222,792 B1 | * | 4/2001 | Hanzawa et al. | ........... 365/233 |
| 6,396,322 B1 | * | 5/2002 | Kim et al. | ................... 327/158 |
| 6,489,824 B2 | * | 12/2002 | Miyazaki et al. | ........... 327/158 |
| 6,570,419 B2 | * | 5/2003 | Hanzawa et al. | ........... 327/152 |
| 6,617,894 B2 | * | 9/2003 | Yoon et al. | ................... 327/161 |
| 2004/0178836 A1 | * | 9/2004 | Kim et al. | ................... 327/161 |

* cited by examiner

*Primary Examiner*—Timothy P. Callahan
*Assistant Examiner*—Cassandra Cox
(74) *Attorney, Agent, or Firm*—F. Chau & Associates, LLC

(57) ABSTRACT

A synchronous mirror delay circuit comprises a delay monitor circuit for delaying a reference clock signal from a clock buffer circuit. A forward delay array sequentially delays an output clock signal of the delay monitor circuit to generate delay clock signals, and the mirror control circuit detects a delay clock signal synchronized with the reference clock signal among the delay clock signals. A backward delay array delays a clock signal delayed by the mirror control circuit, and a clock driver receives an output clock signal of the backward delay array to generate the internal clock signal. A locking range control circuit controls a delay time of each clock signal transferred to the delay monitor circuit by the amount of a delay time of each signal transferred to the clock driver when none of delay clock signals of the forward delay array is synchronized with the reference clock signal.

16 Claims, 11 Drawing Sheets

SYNCHRONOUS MIRROR DELAY CIRCUIT WITH ADJUSTABLE LOCKING RANGE

FIELD OF THE INVENTION

The present invention relates to electronic devices and, more particularly, to electronic devices operating in synchronization with an external clock signal.

BACKGROUND

With advances in CMOS integrated circuit technologies, operating speeds of integrated circuits have been remarkably enhanced. Accordingly, there is a demand for improvement of a clock signal for driving the integrated circuits including the need for operation of the clock signal at higher frequencies. The biggest problem resulting from the increase in clock frequency is a clock skew that occurs between an external clock signal and an internal clock signal. Clock skews cause errors in operation. Feedback correcting circuits such as phase locked loop (PLL) circuits and delay locked loop (DLL) circuits have been used to generate clock signals with minimized clock skew. However, a lock time of several clock cycles is needed to achieve phase lock. To shorten this lock time, a synchronous mirror delay (SMD) circuit has been proposed. The SMD circuit typically generates an internal clock signal synchronized with an external clock signal in two cycles.

A block diagram of a prior art synchronous mirror delay circuit is illustrated in FIG. 1. Waveform diagrams of input and output signals in each unit for generating an internal clock signal are illustrated in FIG. 2A through FIG. 2F.

Referring to FIG. 1, a synchronous mirror delay circuit includes a clock buffer circuit 10, a delay monitor circuit (DMC) 12, a forward delay array (FDA) 14, a mirror control circuit (MCC) 16, a backward delay circuit (BDA) 18, a clock driver 20, and a dummy load 22.

The clock buffer circuit 10 receives an external clock signal CLKext to generate an input clock signal CLKin having one-shot pulse shape. The input clock signal CLKin is delayed for a delay time of "Td1" by the clock buffer circuit 10. The delay monitor circuit 12 delays an input clock signal CLKin from the clock buffer circuit 10 for a delay time of "Td1+Td2". The forward delay array 14 has a plurality of serially-connected delay units FD1–FDn and outputs a plurality of delayed clock signals FDA1–FDAn. The delay units FD1–FDn are controlled by the mirror control circuit 16, as shown in FIG. 1. Each of the delay units FD1–FDn is set to have the same delay time, and comprises a NAND gate and an inverter. The mirror control signal 16 includes a plurality of phase detectors PD1–PDn each receiving an input clock signal CLKin from the clock buffer circuit 10 and a delayed clock signal FDAi from a corresponding delay unit FDi in the forward delay array 14. The phase detector PDi (i=1–n) detects whether the inputted clock signals CLKin and FDAi have the same phase. That is, the mirror control circuit 16 detects a delayed clock signal FDAi delayed for one cycle relative to an input clock signal CLKin from the clock buffer circuit 10, i.e., the delayed clock signal FDAi having a phase difference of one cycle. This means a delay time of the forward delay array 14 becomes "Tclk−(Td1+Td2)". The backward delay array 18 includes a plurality of serially-connected delay units BD1–BDn. The delay unit BDi (i=1–n) is set to have the same delay time as the delay unit FDi of the forward delay array 14, and comprises a NAND gate and an inverter. The clock driver 20 delays a clock signal BDAout from the backward delay array 18 for a delay time of the "Td2" to generate an internal clock signal CLKint. The internal clock signal CLKint has the same phase as the external clock signal CLKext. The dummy load 22 is added to make symmetrical the forward delay array 14 and the mirror control circuit 16 to the backward delay array 18 and the dummy load 22.

The operation of the prior art synchronous mirror delay circuit is now described with reference to FIG. 2A through FIG. 2F.

When a clock signal CLKext shown in FIG. 2A is externally inputted, the clock buffer circuit 10 generates an input clock signal CLKin shown in FIG. 2B. The input clock signal CLKin is delayed for a delay time of "Td1" by the clock buffer circuit 10. Next, the delay monitor circuit 12 delays the input clock signal CLKin for a delay time of "Td1+Td2". A clock signal FDAin shown in FIG. 2C is inputted to the forward delay array 14. The forward delay array 14 sequentially delays the clock signal FDAin through the delay units FD1–FDn. The mirror control circuit 16 compares the input clock signal CLKin with each of delayed clock signals FDA1–FDAn to generate pulse signals at an instant where input clock signals have the same phase. For example, assuming that one of pulse signals from the mirror control circuit 16 has a low level, and the others have a high level, the mirror control circuit 16 detects a delayed clock signal FDAi (having a phase difference of one cycle) that is delayed for one cycle relative to an input clock signal CLKin from the clock buffer circuit 10. The detected delayed clock signal FDAi is outputted as an internal clock signal CLKint through the backward delay array 18 and the clock driver 20.

The following equation exhibits the total time required for phase-synchronizing an external clock signal CLKext and an internal clock signal CLKint.

$$T\_tot = Td1 + (Td1+Td2) + 2\{Tclk - (Td1+Td2)\} + Td2 = 2Tclk \quad \text{[Equation 1]}$$

In the equation, "Td1" represents a delay time of the clock buffer circuit. "Td1+Td2" is a delay time of a delay monitor circuit 12. "Tclk−(Td1+Td2)" represent a delay time of forward/backward delay arrays 14 and 18 at the time when an input signal CLKin provided to the mirror control circuit 16 is phase-synchronized with a clock signal passing the forward delay array 14. "Td2" represents a delay time of the clock driver 20. Given the equation above, the internal clock signal CLKint is synchronized with the external clock signal CLKext at two cycles. That is, the internal clock signal CLKint is synchronized with an (N+2)th external clock signal CLKext based on an Nth external clock signal CLKext, as shown in FIG. 2. As a result, after an external clock signal CLKext is inputted, an internal clock signal CLKint synchronized with the external clock signal CLKext is generated.

Generally, factors affecting performance of a synchronous mirror delay circuit include jitter and locking range. The jitter of the synchronous mirror delay circuit means a time error between an external clock signal CLKext and an internal clock signal CLKint, and has a value within a delay time of each delay unit in the delay arrays 14 and 18. The synchronous mirror delay circuit is an open-loop-shaped delay line, having a jitter resolution within one delay unit. The locking range of the synchronous mirror delay circuit means a range where a delayed clock signal FDAi synchronized with an input clock signal CLKin is detected through the forward delay array 14.

In general, the locking range correlates with jitter in view of delay units. For example, where the locking range is sought to increase with delay units unchanged in number, jitter is increased. Thus, to increase the locking range with jitter unchanged, the delay units have to increase in number. There is usually such a trade-off between jitter and locking range.

For more detail, the synchronous mirror delay circuit having a locking range of "Tclk−(Td1+Td2)" is shown in FIG. 1 and FIG. 2. To widen the locking range thereof, a value of "Tclk−(Td1+Td2)" should be increased by decreasing "Td1" and "Td2". However, to keep jitter unchanged, the delay units should increase in number.

On the other hand, where jitter is sought to reduce with the locking range unchanged, a jitter resolution must be increased using more delay units. This is because jitter has a value within the time of a delay unit. A need therefore exists for a synchronous mirror delay circuit having an adjustable locking range.

SUMMARY OF THE INVENTION

Embodiments of the present invention are directed to a synchronous mirror delay circuit having an adjustable locking range. According to an embodiment of the invention, a clock generating circuit generates an internal clock signal synchronized with an external clock signal. A clock buffer circuit buffers the external clock signal to generate a reference clock signal, and a delay monitor circuit delays the reference clock signal. A forward delay array sequentially delays an output clock signal of the delay monitor circuit in a forward direction to generate delayed clock signals. The mirror control circuit detects a clock signal synchronized with the reference clock signal, among the delayed clock signals. A backward delay array delays the delayed clock signal detected by the mirror control circuit in a backward direction. A clock driver receives an output clock signal of the backward delay array to generate the internal clock signal. A locking range control circuit operates in response to a part of the delayed clock signals and detects whether one of the delayed clock signals of the forward delay array is synchronized with the reference clock signal. When none of the delayed clock signals of the forward delay array is synchronized with the reference clock signal, the locking range control circuit controls a delay time of each clock signal transferred to the delay monitor circuit by the amount of a delay time of each signal transferred to the clock driver.

Preferably, when a phase of a clock signal passing the forward delay array leads a phase of the reference clock signal, the locking range control circuit increases a delay time of the respective clock signals transferred to the delay monitor and to the clock driver.

When a phase of the reference clock signal leads a phase of a clock signal passing the forward delay array, the locking range control circuit decreases a delay time of the respective clock signals transferred to the delay monitor and to the clock driver.

When a first delayed clock signal of the forward delay array is iteratively generated, the locking range control circuit increases a delay time of the respective clock signals transferred to the delay monitor circuit and to the clock driver.

When the last delayed clock signal of the forward delay array is iteratively generated, the locking range control circuit decreases a delay time of the respective clock signals transferred to the delay monitor circuit and to the clock driver.

According to a preferred embodiment, the locking range control circuit comprises: a first delay circuit for sequentially delaying the reference clock signal to generate a plurality of first delayed reference clock signals; a second delay circuit for sequentially delaying the output clock signal of the backward delay array to generate a plurality of second delayed reference clock signals; a controller for detecting whether the last delayed clock signal of the forward delay array is iteratively generated and for activating one of a plurality of select signals based on a detection result; a first selector for selecting one of the first delayed reference clock signals of the first delay circuit in response to the activated select signal to output the select clock signal as an input clock signal of the delay monitor circuit; and a second selector for selecting one of the second delayed reference clock signals of the second delay circuit in response to the activated select signal to output the selected clock signal as an input clock signal of the clock driver. The clock signal selected by the first selector has the same delay time as the clock signal selected by the second selector.

The controller comprises a detector for detecting whether the last delayed clock signal of the forward delay array is iteratively generated predetermined times and for generating a count-up signal when the last delayed clock signal of the forward delay circuit is generated the predetermined times, a counter for carrying out a count-up operation in response to the count-up signal, and a select signal generator for generating the select signals in response to an output of the counter.

In another embodiment of the invention, a locking range control circuit comprises: a first delay circuit for sequentially delaying the reference clock signal to generate a plurality of first delayed reference clock signals; a second delay circuit for sequentially delaying the output clock signal of the backward delay array to generate a plurality of second delayed reference clock signals; a controller for detecting whether the last or first delayed clock signal of the forward delay array is iteratively generated and for activating one of a plurality of select signals based on the detection result; a first selector for selecting one of the first delayed reference clock signals of the first delay circuit in response to the activated select signal to output the selected clock signal as an input signal of the delay monitor circuit; and a second selector for selecting one of the second delayed reference clock signals of the second delay circuit in response to the activated select signal to output the selected clock signal as an input clock signal of the clock driver.

The controller comprises a first detector for detecting whether the last delayed clock signal of the forward delay array is iteratively generated predetermined times and for generating a count-up signal when the last clock signal of the forward delay array is iteratively generated the predetermined times, a second detector for detecting whether a first delayed clock signal of the forward delay array is iteratively generated predetermined times and for generating a count-down signal when the first delayed clock signal of the forward delay array is iteratively generated the predetermined times, a counter for carrying out a count-up or count-down operation in response to the count-up or count-down signal, and a select signal generator for generating the select signals in response to an output of the counter.

These and other aspects and features of the present invention will be described or become apparent from the following detailed description of preferred embodiments, which is to be read in connection with the accompanying drawings.

DESCRIPTION OF PREFERRED EMBODIMENTS

A synchronous mirror delay circuit according to an embodiment of the present invention includes a locking range control circuit for controlling a locking range. When a phase of a clock signal passing a forward delay array leads a phase of a clock signal inputted to a mirror control circuit, the locking range control circuit controls a locking range so as to delay the phase of the inputted clock signal (or increases a delay time of the inputted clock signal). When the phase of the clock signal passing the forward delay array lags behind the phase of the clock signal inputted to the mirror control signal, the locking range control signal controls the locking range so as to advance the phase of the inputted clock signal (or decreases the delay time of the inputted clock signal). In such a control manner, a locking range of a synchronous mirror delay circuit becomes adjustable without increasing jitter and the number of delay units. This will be explained in more detail later.

Figure 1:
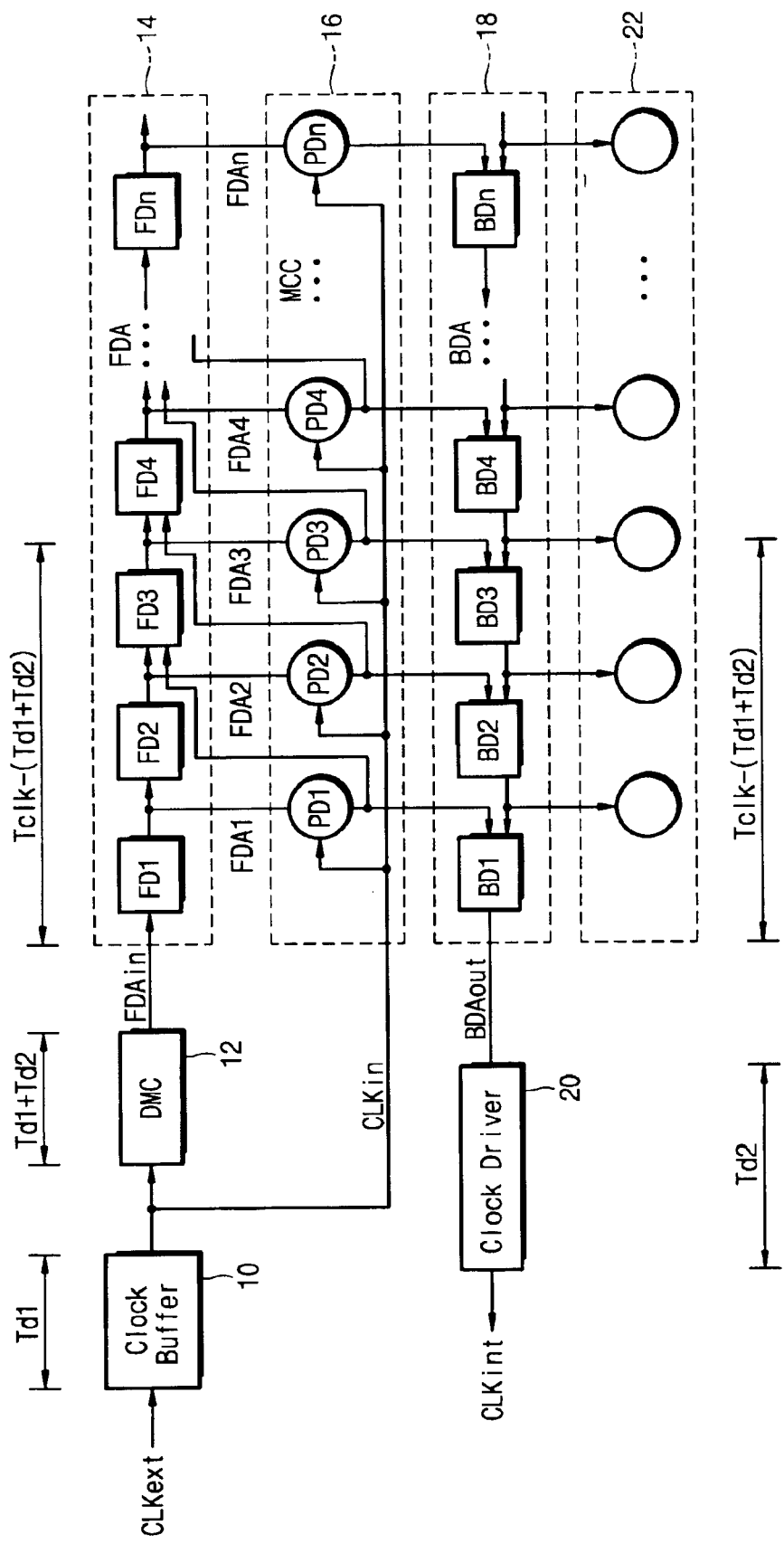
FIG. 1 is a block diagram of a conventional synchronous mirror delay circuit.
Figure 2:
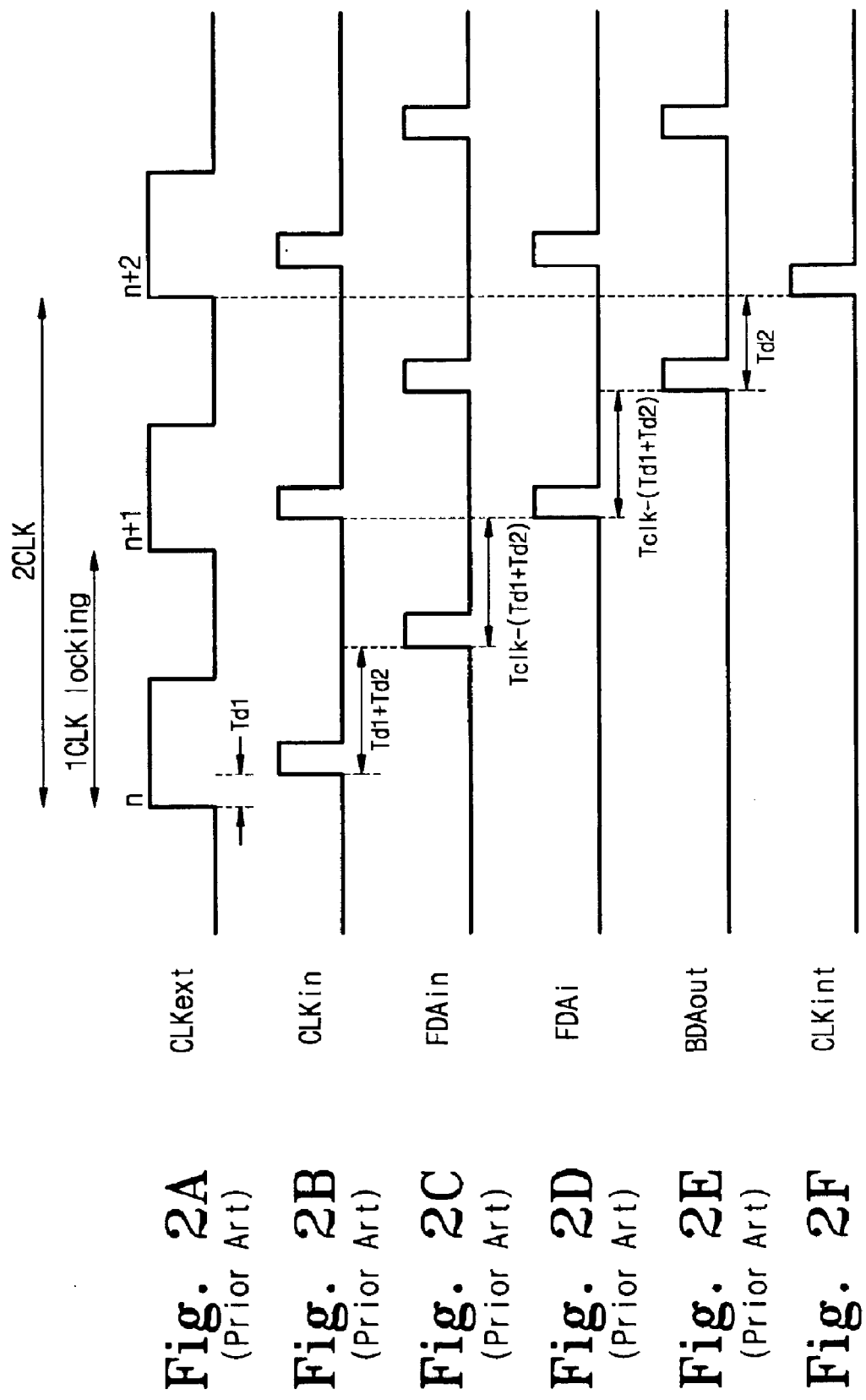
FIGS. 2A, 2B, 2C, 2D, 2E, and 2F are timing diagrams of the synchronous mirror delay circuit shown in FIG. 1.
Figure 3:
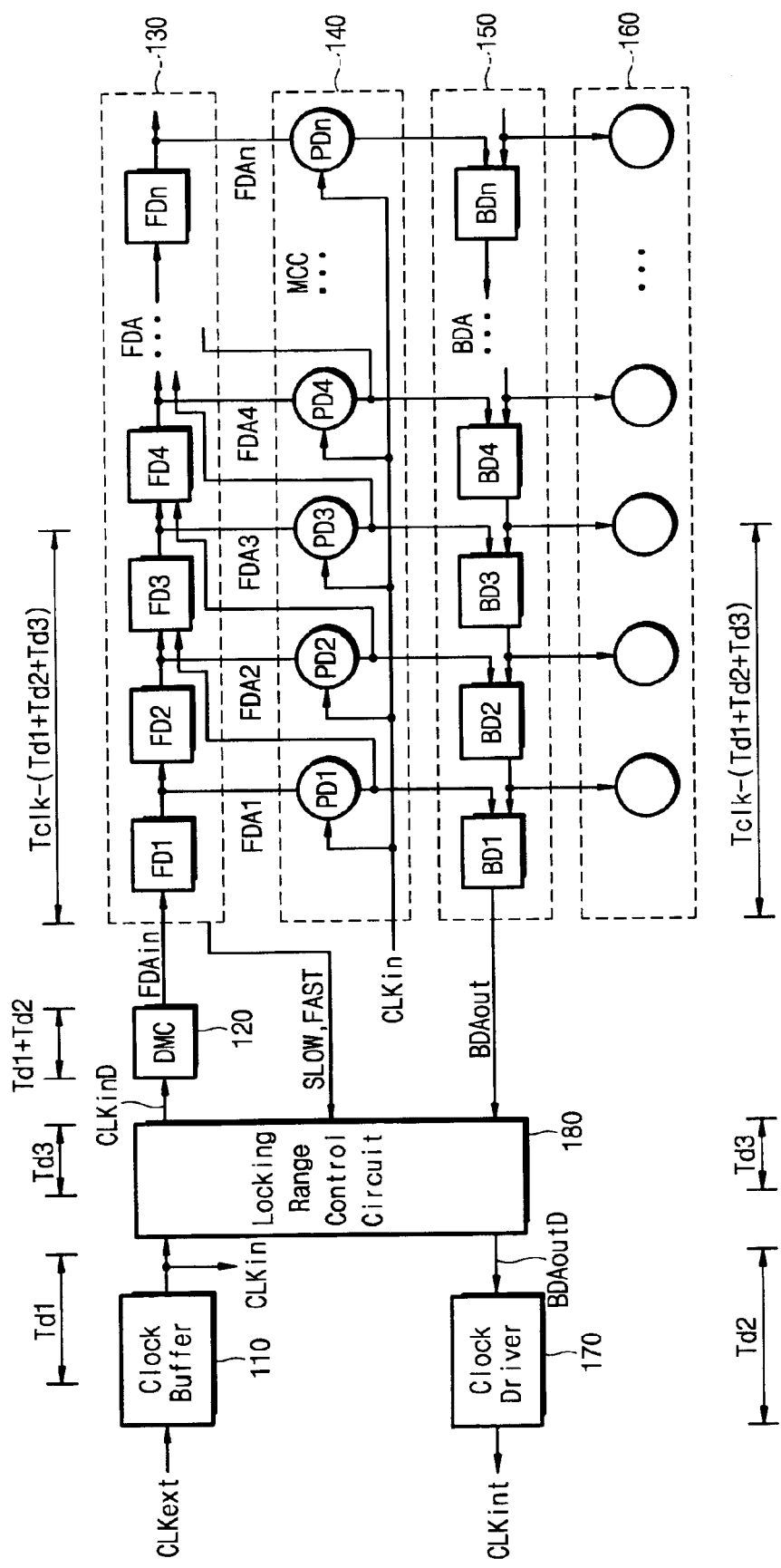
FIG. 3 is a block diagram of a synchronous mirror delay circuit according to an embodiment of the present invention.

A synchronous mirror delay circuit according to an embodiment of the invention is schematically illustrated in FIG. 3. A synchronous mirror delay circuit 100 is a circuit for generating a clock signal and includes a clock buffer circuit 110, a delay monitor circuit (DMC) 120, a forward delay array (FDA) 130, a mirror control circuit (MCC) 140, a backward delay array (BDA) 150, a dummy load 160, a clock driver 170, and a locking range control circuit 180.

The clock buffer circuit 110 receives an external clock signal CLKext to generate a clock signal CLKin with a type of short pulse. The input clock signal CLKin is delayed for a delay time of "Td1" by the clock buffer circuit 110. The delay monitor circuit 120 delays for a delay time of "Td1+Td2" the input clock signal CLKin, which is outputted from the clock buffer circuit 110 through the locking range control circuit. The forward delay array 130 has a plurality of serially-connected delay units FD1–FDn and outputs a plurality of delayed clock signals FDA1–FDAn. The delay units FD1–FDn of the forward delay array 130 are controlled by the mirror control circuit 140, as shown in FIG. 3. Each of the delay units FD1–FDn is set to have the same delay time and may comprise a NAND gate and an inverter.

The mirror control circuit 140 has a plurality of phase detectors PD1–PDn, each detector receiving an input clock signal CLKin from the clock buffer circuit 110 and a delayed clock signal FDAi from a corresponding delay unit FDi in the forward delay array 130. Namely, the mirror control circuit 140 detects a delayed clock signal FDAi delayed for one cycle relative to the input clock signal CLKin from the clock buffer circuit 110, i.e., the delayed clock signal FDAi having a phase difference of one cycle. The backward delay array 150 has a plurality of serially-connected delay units BD1–BDn each having the same delay time as each delay unit of the forward delay array 130 has. Preferably, each of the delay units BD1–BDn comprises a NAND gate and an inverter. The dummy load 160 is added for the forward delay array 130 and the mirror control circuit 140 to be symmetrical to the backward delay array 150 and the dummy load 160. The clock driver 170 delays for a delay time of "TD2" a clock signal BDAout, which is outputted from the backward delay array 150 through the locking range control circuit 180, to output an internal clock signal CLKint which is phase-synchronized with an external clock signal CLKext.

An example of the clock buffer circuit 110, the delay monitor circuit 120, the forward delay array 130, the mirror control circuit 140, the backward delay array 150, the dummy load 160, and the clock driver 170 is disclosed in U.S. Pat. No. 6,239,641 entitled "Delay Locked Loop Using Bidirectional Delay"), which is incorporated herein by reference in its entirety.

The locking range control circuit 180 shown in FIG. 3 controls a delay time of a clock signal inputted to the delay monitor circuit 120 and a delay time of a clock signal inputted to the clock driver 170 in response to flag signals FAST and SLOW provided from the forward delay array 130. For example, when a phase of a clock signal passing the forward delay array 130 leads/lags behind a phase of a clock signal inputted to the mirror control circuit 140, the locking range control circuit 180 increases/decreases a delay time of a clock signal inputted to the delay monitor circuit 120 by the amount of a delay time of a clock signal inputted to the clock driver 170.

For example, the locking range control circuit 180 controls a delay time of the internal clock signal CLKin outputted from the clock buffer 110 in response to the flag signals FAST and SLOW, and transfers a clock signal CLKinD having a controlled delay time to the delay monitor circuit 120. A delay time of a clock signal BDAout outputted from the backward delay array 160 is controlled by the locking range control circuit 180 so that the clock signal BDAout may have the same delay time as the clock signal CLKin.

According to the embodiment of the invention, when a phase of a clock signal passing the forward delay array 130 leads or lags behind a phase of a clock signal inputted to the mirror control circuit 140, a locking range of the mirror control circuit 140 can be readjusted without increasing jitter and the number of delay units.

Figure 4:
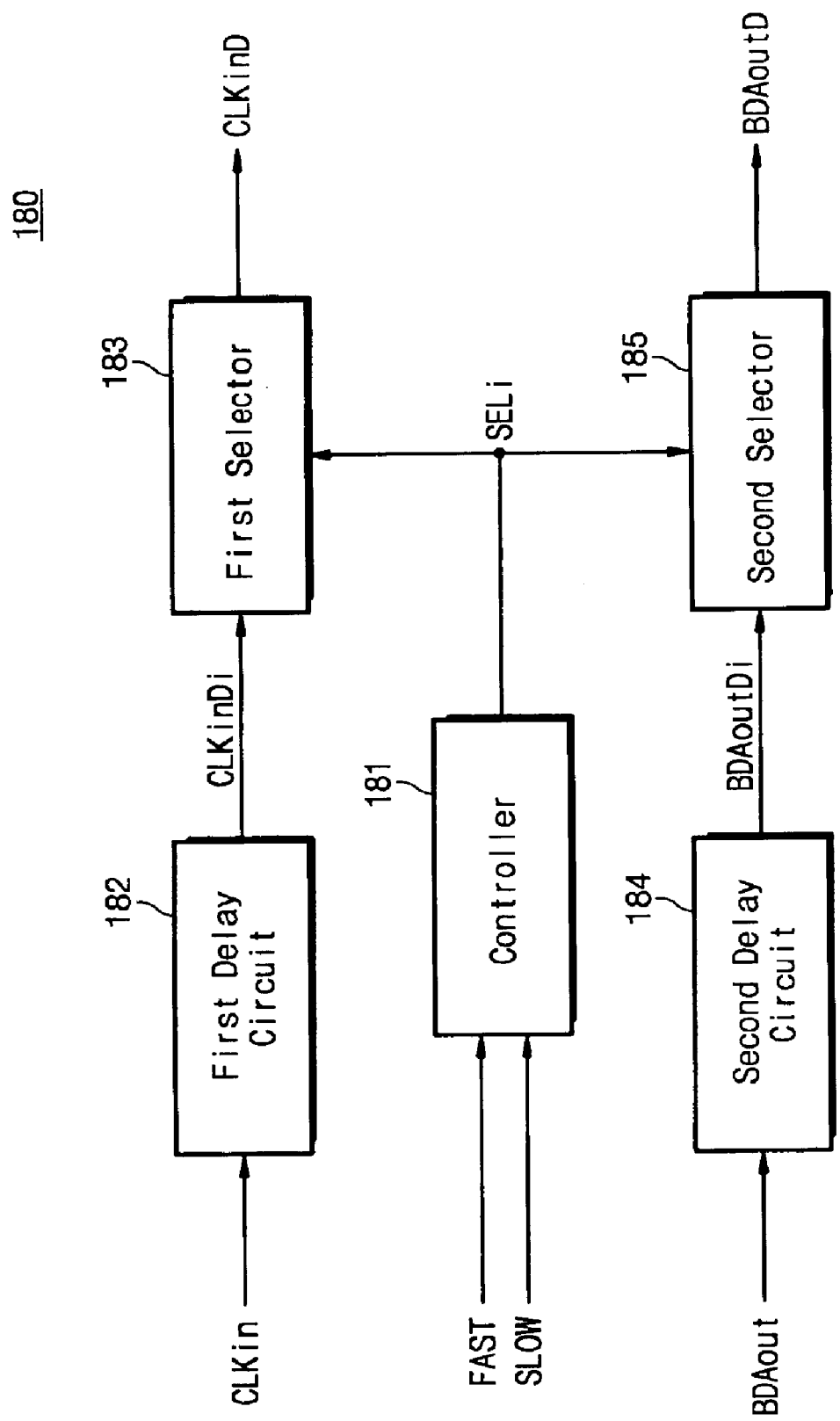
FIG. 4 is a block diagram of a locking range control circuit shown in FIG. 3.

As shown in FIG. 4, the locking range control circuit 180 includes a controller 181, a first delay circuit 182, a first selector 183, a second delay circuit 184, and a second selector 185.

Figure 5:
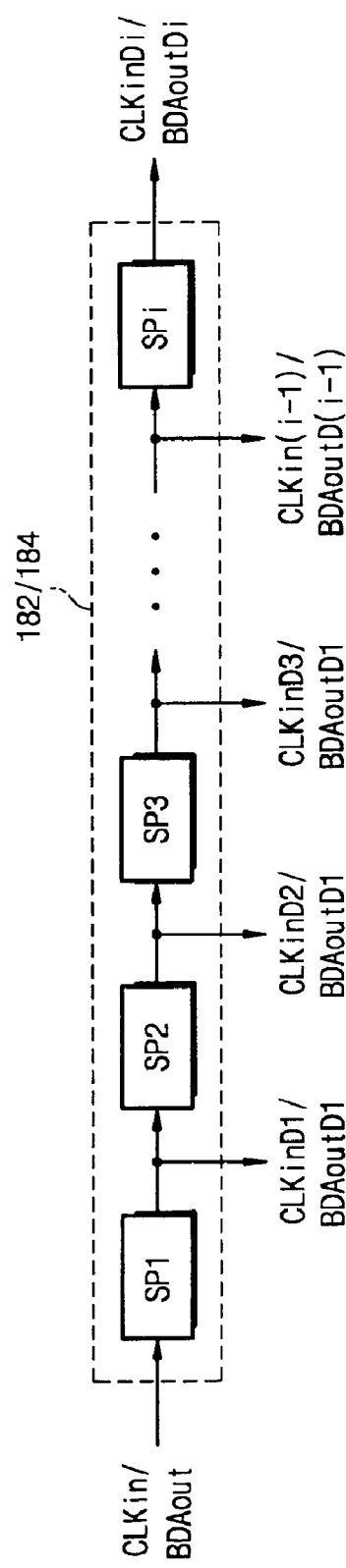
FIG. 5 is a block diagram of a first delay circuit and a second delay circuit shown in FIG. 4.
Figure 6:
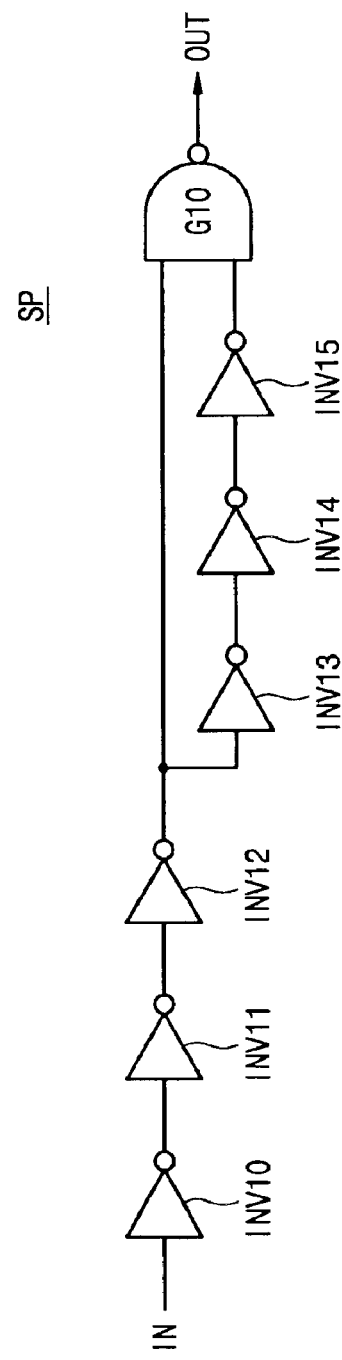
FIG. 6 shows a short pulse generator shown in FIG. 5.

The first delay circuit 182 sequentially delays the clock signal CLKin from the clock buffer circuit 110 to generate a plurality of delayed clock signals CLKinD_i (i=1–8). The second delay circuit 184 sequentially delays the clock signal BDAout from the backward delay array 150 to generate a plurality of delayed clock signals BDAout_i. Each of the delay circuits 182 and 184 has a plurality of short pulse generators SP, as shown in FIG. 5. Preferably, each of the short pulse generators SP comprises inverters INV10–INV15 and a NAND gate G10, which are connected as shown in FIG. 6.

Returning to FIG. 4, the controller 181 operates in response to the flag signals FAST and SLOW from the forward delay array 130, and detects whether the flag signal FAST is generated predetermined times and whether the flag signal SLOW is generated predetermined times. When the flag signal FAST is generated predetermined times (e.g., eight times), the controller 181 activates one of select signals SELi (i=1–8) to increase each delay time of the clock signals CLKin and BDAout. When the flag signals SLOW is generated predetermined times (e.g., eight times), the controller 181 activates one of the select signals SELi (i=1–8) to decrease each delay time of the clock signals CLKin and BDAout. The select signals SELi correspond to output signals CLKinDi of the first delay circuit and output signals BDAoutDi of the second delay circuit 184, respectively. The first selector 183 receives the output signals CLKinDi from the first delay circuit 182, and selects an output signal CLKinDi corresponding to an activated one of the select signals SELi as an input clock signal of the delay monitor circuit 120. The second selector 185 receives the output signals BDAoutDi from the second delay circuit 183, and selects an output signal BDAoutDi corresponding to an activated one of the select signals SELi as an input clock signal of the clock driver 170.

Figure 7:
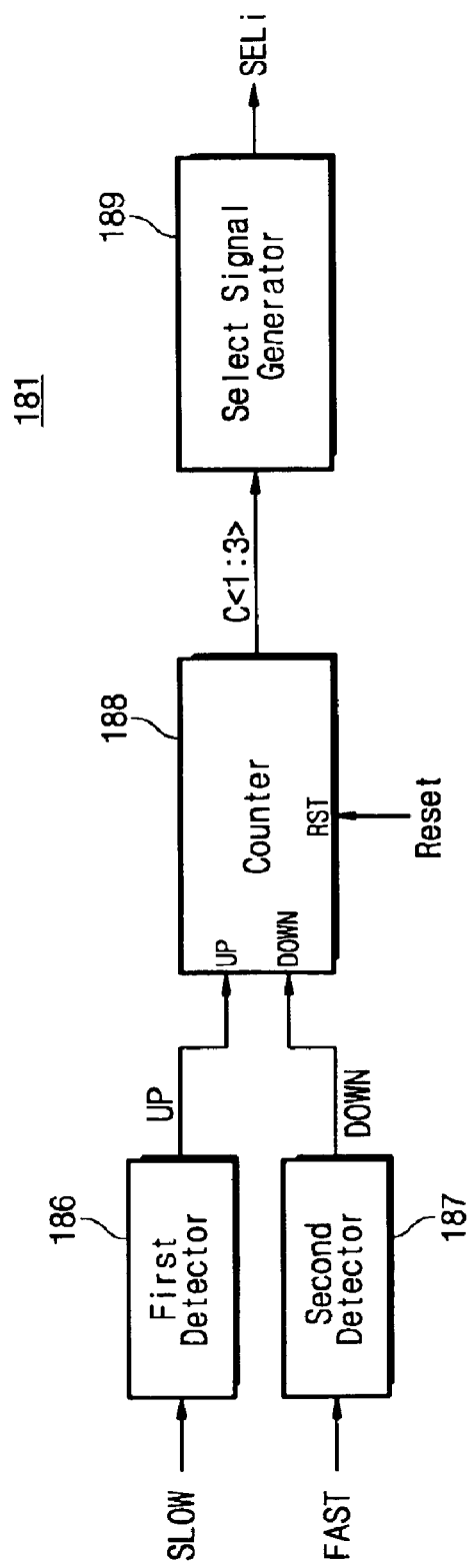
FIG. 7 is a block diagram of a controller shown in FIG. 4.
Figure 8:
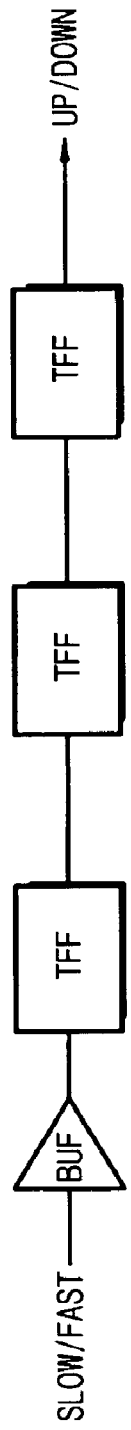
FIG. 8 is a block diagram of a first detector and a second detector shown in FIG. 7.

As shown in FIG. 7, the controller 181 includes a first detector 186, a second detector 187, a counter 188, and a select signal generator 189. The first detector 186 detects whether the flag signal SLOW is generated predetermined times. When the flag signal SLOW is generated the predetermined times, the first detector 186 generates a count-up signal UP. The second detector 187 detects whether the flag signal FAST is generated predetermined times. When the flag signal FAST is generated the predetermined times, the second detector 187 generates a count-down signal DOWN. Each of the detectors 186 and 187 comprises a frequency divider having a buffer BUF and three T flip-flops TFF, which are connected as shown in FIG. 8. The detectors 186 and 187 can be constructed by logic circuits known to one skilled in the art.

Figure 9:
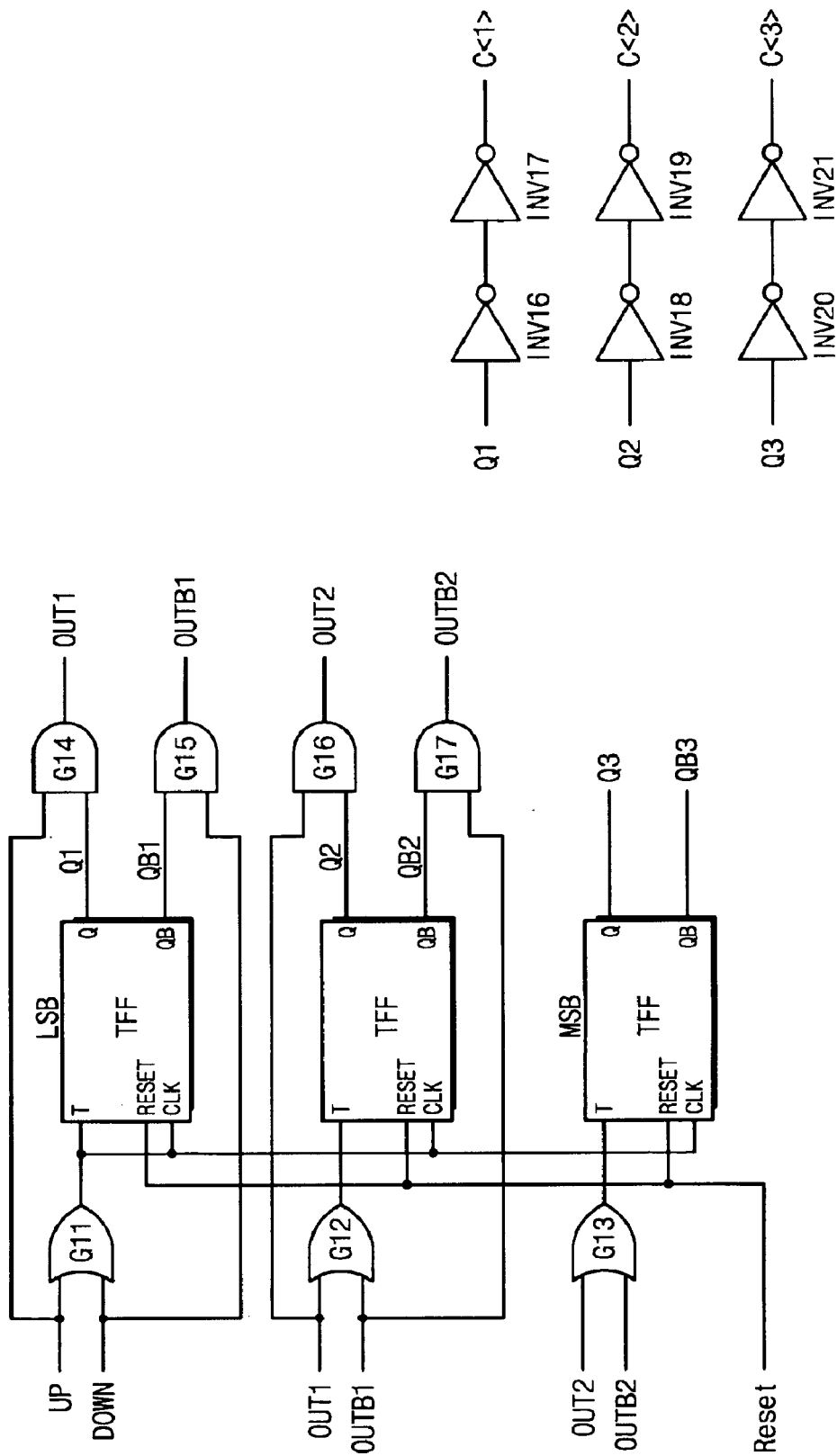
FIG. 9 shows an up-down counter shown in FIG. 7.
Figure 10:
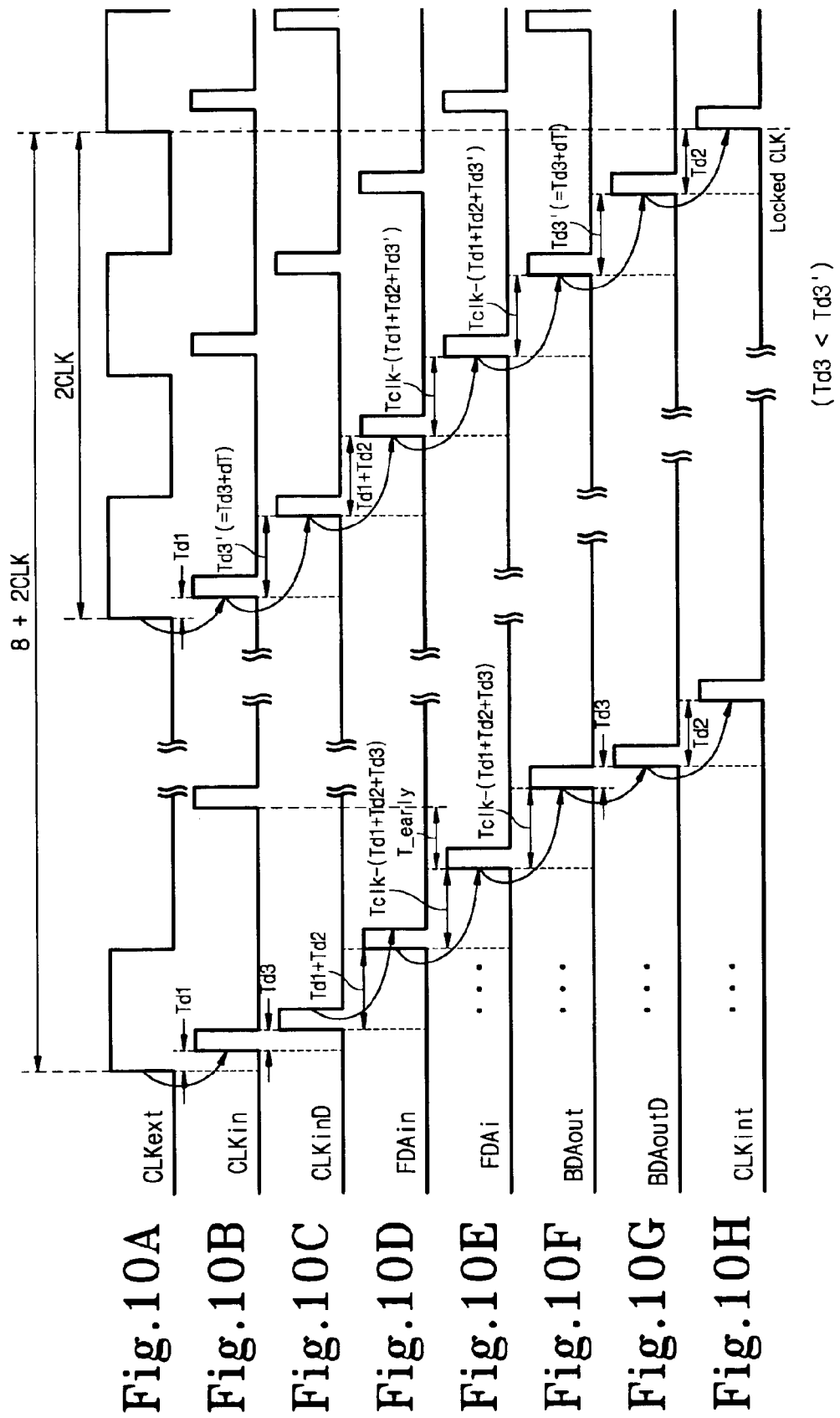
FIGS. 10A, 10B, 10C, 10D, 10E, 10F, 10G, and 10H are timing diagrams of the synchronous mirror delay circuit according to an embodiment of the invention when a phase of a clock signal passing a forward delay array leads a phase of a clock signal inputted to a mirror control circuit.
Figure 11:
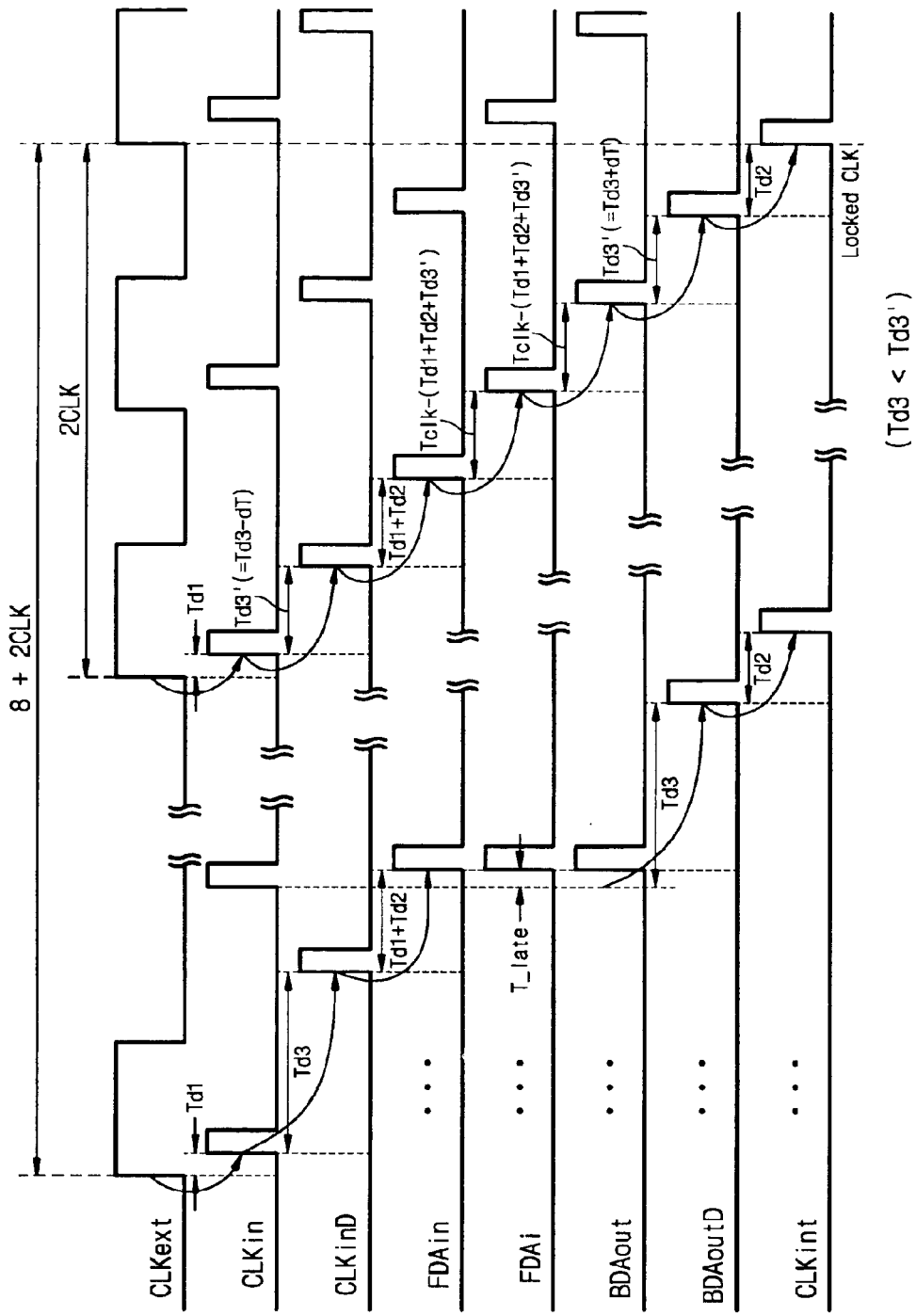
FIGS. 11A, 11B, 11C, 11D, 11E, 11F, and FIG. 11H are timing diagrams of the synchronous mirror delay circuit according to an embodiment of the invention when a phase of a clock signal passing a forward delay array lags behind a phase of a clock signal inputted to a mirror control circuit.

Returning to FIG. 7, the counter 188 is an up-down counter that carries out a count-up operation in response to the count-up signal UP from the first detector 186 and carries out a count-down operation in response to the count-down signal DOWN from the second detector 187. The counter 188 has three OR gates G11, G12, and G13, three flip-flops TFF, four AND gates G14, G15, G16, and G17, and six inverters INV16–INV21, which are connected as shown in FIG. 9. The counter 188 can be constructed by logic circuits known to one skilled in the art. The counter 188 is reset by a reset signal RESET. For example, a power-on-reset signal generated from a power-on reset circuit well known in the art is used as the reset signal RESET. The select signal generator 189 activates one of the select signals SELi in response to an output of the counter 188.

In this embodiment, the flag signal SLOW is a delayed clock signal outputted from the last delay unit FDn of the forward delay array 130. The flag signal FAST is a delayed clock signal outputted from the first delay unit FD1 of the forward delay array 130. The iterative generation of the flag signal SLOW means a phase of a clock signal passing the forward delay array 130 leads a phase of a clock signal inputted to the mirror control circuit 140. This state may be overcome by delaying the phase of the clock signal passing the forward delay array 130. Preferably, as the count-up signal UP is generated from the first detector 186, the select signal generator 189 generates a select signal SELi in response to an output of the counter 189. The first and second selectors 183 and 185 select the clock signals CLKinDi and BDAoutDi having a delay time longer than the previous delay time in response to the select signal SELi, respectively. Meanwhile, the iterative generation of the clock signal FAST means the phase of the clock signal passing the forward delay array 130 lags behind the phase of the clock signal inputted to the mirror control circuit 140. This state may be overcome by advancing the phase of the clock signal passing the forward delay array 130. Preferably, as the count-down signal DOWN is generated from the second detector 187, the select signal generator 189 generates a select signal SEL in response to an output of the counter 188. The first and second selectors 183 and 185 select the clock signals CLKinDi and BDAoutDi having a delay time shorter than the previous delay time in response to the select signal SELi, respectively.

Timing diagrams of the synchronous mirror delay circuit according to the embodiment of the invention are illustrated in FIG. 10A through FIG. 10H and FIG. 11A through FIG. 11H. When a phase of a clock signal passing the forward delay array 130 leads a phase of a clock signal inputted to the mirror control circuit 140, the operations of the synchronous mirror delay circuit will be now described in detail with reference to the timing diagrams of FIG. 10A through FIG. 10H.

An external clock signal CLKext is transferred to two paths via the clock buffer circuit 110 as in FIG. 3. The first path includes the locking range control circuit 180 (specifically, the first delay circuit and the first selector), the delay monitor circuit 120, and the forward delay array 130. The second path includes the mirror control circuit 140. In the first path, an internal clock signal CLKin from the clock buffer circuit 110 is delayed for a delay time of "Td3" by the first delay circuit 182 of the locking range control circuit 180 and is delayed for a delay time of "Td1+Td2" by the delay monitor circuit 120. A delayed clock signal FDAin is to be sequentially delayed by the delay units FD1–FDn of the forward delay array 130. Afterwards, the mirror control circuit 140 detects whether a clock signal delayed by each delay unit has a phase difference of one cycle relative to the internal clock signal CLKin from the clock buffer circuit 110. If the mirror control circuit detects a clock signal (e.g., FDA3) having a phase difference of one cycle relative to the internal clock signal CLKin, a corresponding comparator (e.g., PD3) is determined as a transfer path of the delayed clock signal FDA3. The delayed clock signal FDA3, which is transferred to the comparator PD3 (designated as a current transfer path), is outputted as an internal clock signal CLKint through the backward delay array 150, the locking range control circuit 180 (specifically, the second delay circuit 184 and the second delay 185), and the clock driver 170.

The following equation exhibits a time required for generating an internal clock signal synchronized with the external clock signal CLKext.

$$T\_tot = Td1 + Td3 + (Td1 + Td2) + \\ 2\{Tclk - Td1 + Td2 + Td3)\} + Td3 + Td2 = 2Tclk \quad \text{[Equation 2]}$$

In the equation, "Td1" represents a delay time of the clock buffer circuit 110. "Td2" represents a delay time of the clock driver 170. "Td3" represents a delay time of the first delay circuit 182 of the locking range control circuit 180. "Td1+Td2" represents a delay time of the delay monitor circuit 120. "Tclk−(Td1+Td2+Td3)" represents a delay time of the forward/backward delay arrays 130 and 150 at the time when an input clock signal CLKin provided to the mirror control circuit 140 is phase-synchronized with a clock signal passing the forward delay array 130. Given the equation, the internal clock signal CLKint is synchronized with the external clock signal CLKext following two cycles. Preferably, two cycles after the external clock signal CLKext is inputted, the internal clock signal CLKint synchronized with the external clock signal CLKext is generated.

However, if the clock signal passing the forward delay array 130 is not synchronized with the clock signal transferred to the mirror control circuit 140, it will be determined that a synchronous mirror delay circuit exceeds a locking range. When a phase of a clock signal FDAi (shown in FIG. 10) passing the forward delay array 130 leads a phase of an input clock signal CLKin (shown in FIG. 10E) transferred to the mirror control circuit 140 by "T_early", the clock signals FDAi and CLKin are not synchronized with each other even in the last delay unit FDn of the forward delay array 130. In this case, no internal clock signal CLKint synchronized with an external clock signal CLKext is generated. Such an asynchronous state occurs because a delay time between the external clock signal CLKext and the internal clock signal CLKint is smaller than "2Tclk". Therefore, for the clock signals FDAi and CLKin to be synchronized with each other, it is necessary to increase a delay time of a clock signal CLKinD inputted to the delay monitor circuit 120. This is achieved through the steps as follows.

When a phase of a clock signal passing the forward delay array 130 leads a phase of an input clock signal transferred to the mirror control circuit 140, an input clock signal FDAn of the last mirror unit FDn is transferred to the locking range control circuit 180 as a flag signal SLOW. A controller 181 of the locking range control circuit 180 determines whether the flag signal SLOW is generated predetermined times (e.g., 8 times). If the flag signal SLOW is not generated the predetermined times, a delay time of a clock signal CLKinD inputted to the delay monitor circuit 120 is not changed. This determination step (on whether the signal SLOW is generated predetermined times) is carried out for determining whether such an asynchronous state results from external conditions such as temperature or noise, or from practical change of the locking range.

If the flag signal SLOW is generated the predetermined times, the controller 181 of the locking range control circuit 180 activates one of the select signals SEL1–SEL7 to select a clock signal, which has a delay time longer than that of a previous clock signal, among clock signals CLKinD1–CLKinD8 generated from the first delay circuit 182. A clock signal CLKinDi, whose delay time is increased (i.e., a clock signal having a delay time of Td3', Td3<Td3'), is transferred to the forward delay array 130 through the delay monitor circuit 120. The forward delay array 130 sequentially delays inputted clock signals CLKinD. The mirror control circuit 140 detects whether a clock signal delayed by each delay unit has a phase difference of one cycle relative to an internal clock signal CLKin from the clock buffer circuit 110. If a delayed clock signal having a phase difference of one cycle relative to the internal clock signal CLKin (e.g., a clock signal of FIG. 10E is detected) is detected, a corresponding comparator PDi is designated as a transfer path of the delayed clock signal FDAi. The delayed clock signal FDAi, which is transferred to the comparator PDi designated as the transfer path, will be transferred as an internal clock signal through the backward delay array 150, the locking range control circuit 180 (specifically, the second delay circuit 184 and the second selector 185), and the clock driver 170, as shown in FIG. 10H.

When the clock signal passing the forward delay array 130 is not synchronized with the input clock signal CLKin transferred to the mirror control circuit 140, the locking range control circuit 180 according to the invention increases each delay time of a clock signal CLKinD inputted to the delay monitor circuit 120 and a clock signal BDAoutD inputted to the clock driver 170 in response to the flag signal SLOW from the forward delay array 130. As a result, the flag signal SLOW is iteratively generated for eight cycles and a delay time of the respective clock signals CLKin and BDAout is re-controlled within a stable range. Next, following two cycles, the internal clock signal CLKint synchronized with the external clock signal CLKext is generated through the same procedure as previously described.

When the clock signal passing the last delay unit FDn of the forward delay array 130 is synchronized with the input clock signal CLKin transferred to the mirror control circuit 140, the flag signal SLOW will be iteratively generated. This means that a synchronous mirror delay circuit will likely exceed the present locking range. Thus, the locking range of the synchronous mirror delay circuit is re-controlled within a stable range in response to the flag signal SLOW.

When a phase of a clock signal passing a forward delay array 130 lags behind the phase of the clock signal inputted to a mirror control circuit 140, operations of a synchronous mirror circuit will be first described with reference to the timing views shown in FIG. 11A through FIG. 11H.

When a phase of a clock signal passing the forward delay array 130 lags behind a phase of a clock signal inputted to the mirror control circuit 140, a clock signal passing the forward delay array CLKin and an input clock signal CLKin transferred to the mirror control circuit 140 are not synchronized with each other. For example, when a phase of a clock signal FDAi (shown in FIG. 11E) passing the forward delay array 130 lags behind a phase of an input clock signal CLKin (shown in FIG. 11B) by "T_late", no internal clock signal CLKint synchronized with an external clock signal CLKext is generated. Such an asynchronous state occurs because a delay time between the external clock signal CLKext and the internal clock signal CLKint is larger than "2Tclk". Thus, for the clock signals FDAi and CLKin to be synchronized with each other, it is necessary to decrease a delay time of a clock signal FDAinD inputted to the delay monitor circuit 120. This process is achieved through the steps as follows.

When the phase of the clock signal passing the forward delay array 130 lags behind the phase of the input signal inputted to the mirror control circuit 140, an output clock signal FDA1 of the first delay unit FD1 will be transferred to the locking range control circuit 180 as a flag signal FAST. The controller 181 of the locking range control circuit 180 determines whether the flag signal FAST is generated predetermined times (e.g., 8 times). If the flag signal FAST is generated the predetermined times, a delay time of a clock signal CLKinD inputted to the delay monitor circuit is not changed.

If the flag signal FAST is generated the predetermined times, the controller 181 of the locking range control circuit 180 activates one of the clock signals SEL1–SEL7 to select a clock signal, which has a delay time shorter than that of a previous clock signal, among clock signals generated from the first delay circuit 182. A clock signal CLKinDi, whose delay time is increased (i.e., a clock signal having a delay time of "Td3", Td3>Td3'), is transferred to the forward delay array 130 through the delay monitor circuit 120. The forward delay array 130 detects whether a clock signal delayed by each delay unit has a phase difference of one cycle relative to an internal clock signal CLKin from the clock buffer circuit 110. If a delayed clock signal having a phase difference of one cycle relative to the internal clock signal CLKin (e.g., a clock signal of FIG. 11E) is detected, a corresponding comparator PDi is designated as a transfer path of a delayed clock signal FDAi. The delayed clock signal FDAi, which is transferred through the comparator PDi designated as a transfer path, will be outputted as an internal clock signal CLKint through the backward delay array 150, the locking range control circuit 180 (specifically, the second delay circuit 184 and the second selector 185), and the clock driver, as shown in FIG. 10H.

If the clock signal passing the forward delay array 130 and the input clock signal CLKin transferred to the mirror control circuit 140 are not synchronized with each other, the locking range control circuit 180 according to the embodiment of the invention decreases each delay time of the clock signal CLKinD inputted to the delay monitor circuit 120 and the clock signal BDAoutD inputted to the clock driver 170 in response to the flag signal FAST from the forward delay array 130. As a result, the flag signal FAST is iteratively generated for eight cycles and the delay time is re-controlled. Preferably, following two cycles, the internal clock signal CLKint synchronized with the external clock signal CLKext is generated through the same procedure as previously described.

When a clock signal passing the first delay unit FD1 of the forward delay array 130 is synchronized with the input clock signal CLKin transferred to the mirror control circuit 140, the flag signal FAST will be also iteratively generated. This means that the synchronous mirror delay circuit will exceed the present locking range. Thus, the locking range of the synchronous mirror delay circuit is re-controlled to be a stable range.

Figure 12:
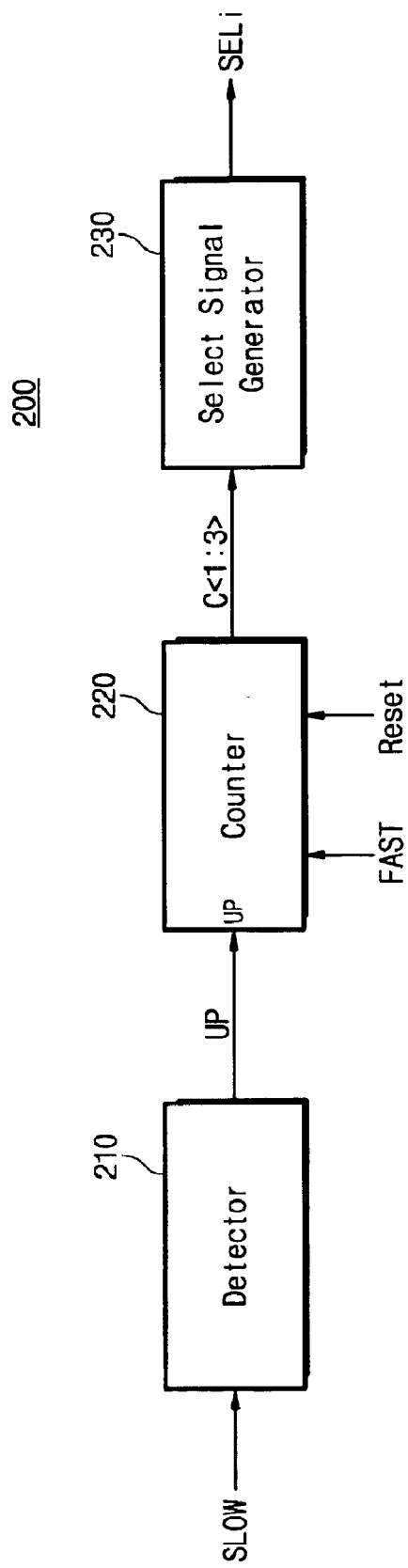
FIG. 12 is a block diagram of a controller of a locking range control circuit according to an embodiment of the present invention.

A controller of a locking range control circuit according to a second embodiment of the invention is schematically illustrated in FIG. 12. A controller 200 includes a detector 210, a counter 220, and a select signal generator 230. A locking range control circuit according to the second embodiment has the same structure as the clocking range control circuit shown in FIG. 4, except that components of the controller 200 are different from those of the controller according to the first embodiment. Therefore, the structure of the locking range control circuit according to the second embodiment will not be described in further detail.

Figure 13:
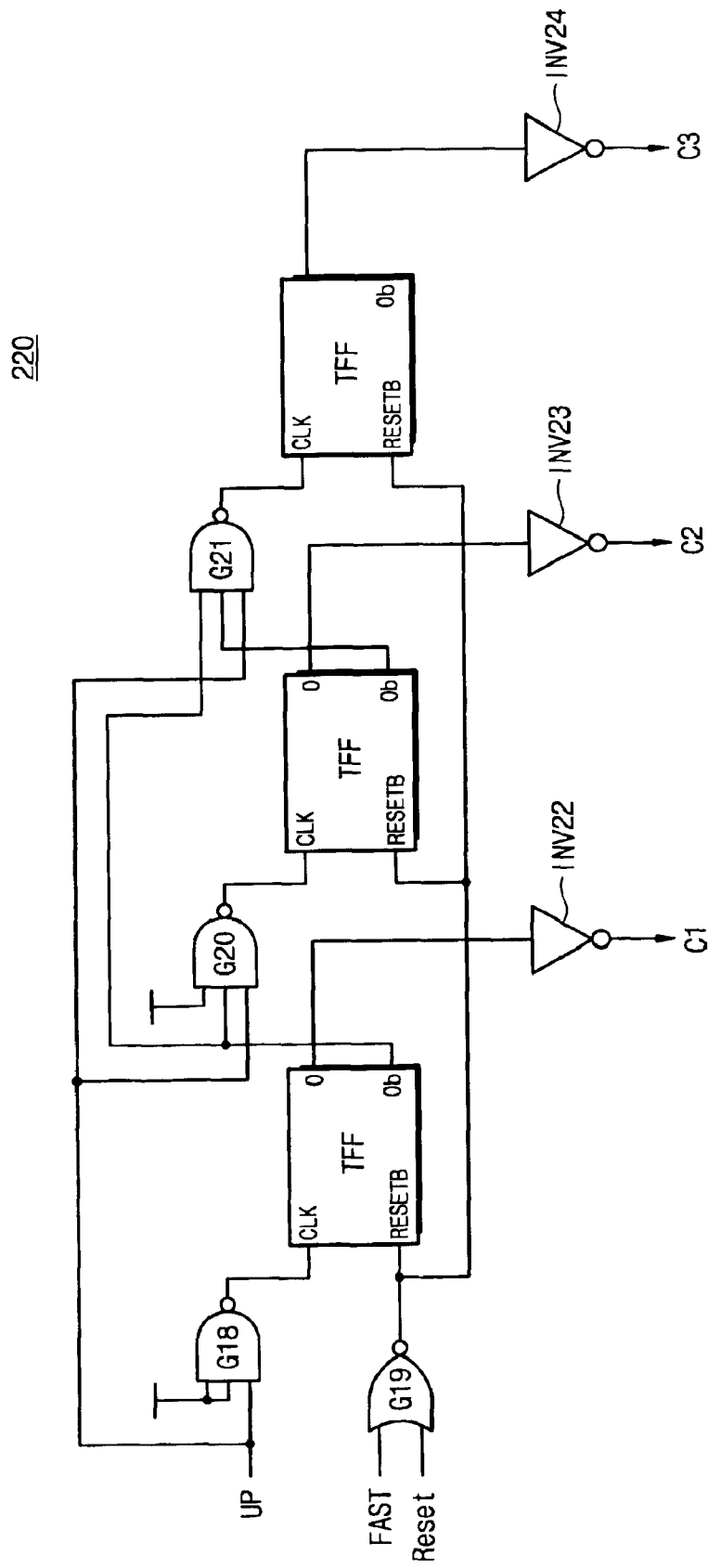
FIG. 13 shows a counter shown in FIG. 12.

A detector 210 detects whether a flag signal SLOW is generated predetermined times. If the flag signal SLOW is generated the predetermined times, the detector 210 generates a count-up signal. The detector 210 comprises a frequency divider having one buffer BUF and three T flip-flops TFF, which are connected as shown in FIG. 8. Whenever the flag signal SLOW is generated eight times, the count-up signal UP is generated. A counter 220 is a 3-bit up counter to carry out a count-up operation in response to the count-up signal UP from the detector 210. The counter 220 has a NOR gate G19, three T flip-flops TFF, and three NAND gates G18, G20, and G21, and three inverters INV22–INV24, which are connected as shown in FIG. 13. The counter 220 is reset by a reset signal Reset or a flag signal FAST. A select signal generator 230 activates one of the select signals SELi in response to an output of the counter 188.

In the locking range control circuit according to the second embodiment, when the flag signal FAST is inputted, the counter 220 is reset to select a clock signal having the shortest delay time among the clock signals CLKinDi generated by the first delay circuit 182. In case of the locking range control circuit according to the first embodiment, a delay time of the clock signal CLKinD is gradually decreased or increased depending on the flag signals FAST and SLOW. On the other hand, in case of the locking range control circuit according to the second embodiment, a delay time of the clock signal FDAinD is gradually increased when the flag signal SLOW is generated, while becoming the shortest time when the flag signal FAST is generated. A delay time control manner according to the second embodiment may be available for a wafer level test where a sufficient synchronous time is secured and a system operates with a lower speed than that of a determined specification.

Although the invention has been described with reference to particular embodiments, the embodiments of the present invention can be modified into various other forms, and the scope of the present invention must not be interpreted as being restricted to the embodiments. It will be apparent to one of ordinary skill in the art that modifications of the described embodiments may be made without departing from the spirit and scope of the invention.

What is claimed is:

1. A clock generation circuit for generating an internal clock signal synchronized with an external clock signal, comprising:
    a clock buffer circuit for buffering the external clock signal to generate a reference clock signal;
    a delay monitor circuit for delaying the reference clock signal;
    a forward delay array for sequentially delaying an output clock signal of the delay monitor circuit in a forward direction to generate delayed clock signals;
    a mirror control circuit for detecting a clock signal synchronized with the reference clock signal among the delayed clock signals;
    a backward delay array for delaying the delayed clock signals detected by the mirror control circuit in a backward direction;
    a clock driver for receiving an output clock signal of the backward delay array to generate the internal clock signal; and
    a locking range control circuit for detecting whether one of the delayed clock signals of the forward delay array is synchronized with the reference clock signal, the locking range control circuit operating in response to at least one of the delayed clock signals,
    wherein the locking range control circuit selectively delays the reference clock signal to synchronize the internal clock signal with the reference clock signal.

2. The clock generation circuit as defined in claim 1, wherein when a phase of a clock signal passing the forward delay array leads a phase of the reference clock signal, the locking range control circuit increases a delay time of the respective clock signals transferred to the delay monitor and to the clock driver.

3. The clock generating circuit as defined in claim 1, wherein when a phase of the reference clock signal leads a phase of a clock signal passing the forward delay array, the locking range control circuit decreases a delay time of the respective clock signals transferred to the delay monitor and to the clock driver.

4. The clock generating circuit as defined in claim 1, wherein when a first delayed clock signal of the forward delay array is iteratively generated, the locking range control circuit increases a delay time of the respective clock signals transferred to the delay monitor circuit and to the clock driver.

5. The clock generating circuit as defined in claim 1, wherein when the last delayed clock signal of the forward delay array is iteratively generated, the locking range control circuit decreases a delay time of the respective clock signals transferred to the delay monitor circuit and to the clock driver.

6. The clock generating circuit as defined in claim 1, wherein the locking range control circuit comprises:
a first delay circuit for sequentially delaying the reference clock signal to generate a plurality of first delayed reference clock signals;
a second delay circuit for sequentially delaying the output clock signal of the backward delay array to generate a plurality of second delayed reference clock signals;
a controller for detecting whether the last delayed clock signal of the forward delay array is iteratively generated and for activating one of a plurality of select signals based on a detection result;
a first selector for selecting one of the first delayed reference clock signals of the first delay circuit in response to an activated select signal to output a select clock signal as an input clock signal of the delay monitor circuit; and
a second selector for selecting one of the second delayed reference clock signals of the second delay circuit in response to the activated select signal to output a selected clock signal as an input clock signal of the clock driver.

7. The clock generating circuit as defined in claim 6, wherein the clock signal selected by the first selector has the same delay time as the clock signal selected by the second selector.

8. The clock generating circuit as defined in claim 6, wherein the controller comprises:
a detector for detecting whether the last delayed clock signal of the forward delay array is iteratively generated predetermined times and for generating a count-up signal when the last delayed clock signal of the forward delay circuit is generated the predetermined times;
a counter for carrying out a count-up operation in response to the count-up signal; and
a select signal generator for generating the select signals in response to an output of the counter.

9. The clock generating circuit as defined in claim 8, wherein the counter is reset when the first delayed clock signal of the forward delay circuit is activated or a power-on-reset signal is activated.

10. The clock generating circuit as defined in claim 9, wherein when the counter is reset, one of the select signals is activated so that the first and second delayed reference clock signal each having a minimal delay time are selected through the first and second selectors.

11. The clock generating circuit as defined in claim 1, wherein the locking range control circuit comprises:
a first delay circuit for sequentially delaying the reference clock signal to generate a plurality of first delayed reference clock signals;
a second delay circuit for sequentially delaying the output clock signal of the backward delay array to generate a plurality of second delayed reference clock signals;
a controller for detecting whether the last or first delayed clock signal of the forward delay array is iteratively generated and for activating one of a plurality of select signals based on the detection result;
a first selector for selecting one of the first delayed reference clock signals of the first delay circuit in response to the activated select signal to output the select clock signal as an input signal of the delay monitor circuit; and
a second selector for selecting one of the second delayed reference clock signals of the second delay circuit in response to the activated select signal to output the selected clock signal as an input clock signal of the clock driver.

12. The clock generating circuit as defined in claim 11, wherein the clock signal selected by the first selector has the same delay time as the clock signal selected by the second selector.

13. The clock generating circuit as defined in claim 11, wherein the controller comprises:
a first detector for detecting whether the last delayed clock signal of the forward delay array is iteratively generated predetermined times and for generating a count-up signal when the last clock signal of the forward delay array is iteratively generated the predetermined times;
a second detector for detecting whether a first delayed clock signal of the forward delay array is iteratively generated predetermined times and for generating a count-down signal when the first delayed clock signal of the forward delay array is iteratively generated the predetermined times;
a counter for carrying out a count-up or count-down operation in response to the count-up or count-down signal; and
a select signal generator for generating the select signals in response to an output of the counter.

14. The clock generating circuit as defined in claim 13, wherein the counter is reset when a power-on-reset signal is activated.

15. The clock generating circuit as defined in claim 14, wherein when the counter is reset, one of the select signals is activated so that the first and second delayed reference clock signal each having a minimal delay time are selected through the first and second selectors.

16. The clock generating circuit as defined in claim 1, wherein the locking range control circuit controls a delay time of each clock signal transferred to the delay monitor circuit by the amount of a delay time of each signal transferred to the clock driver when none of the delayed clock signals of the forward delay array is synchronized with the reference clock signal.

* * * * *